(12) United States Patent
Deng

(10) Patent No.: US 10,362,217 B1
(45) Date of Patent: Jul. 23, 2019

(54) DEVICE FOR OPERATING TOUCH SCREEN UNDERWATER

(71) Applicant: Shenzhen Fengxian Investment Development Co., Ltd., Shenzhen (CN)

(72) Inventor: Xiuhong Deng, Longhui (CN)

(*) Notice: Subject to any disclaimer, the term of this patent is extended or adjusted under 35 U.S.C. 154(b) by 38 days.

(21) Appl. No.: 15/863,778

(22) Filed: Jan. 5, 2018

(51) Int. Cl.
| | |
|---|---|
| G06F 1/16 | (2006.01) |
| H05K 5/06 | (2006.01) |
| G03B 17/08 | (2006.01) |
| H04N 5/232 | (2006.01) |
| H04B 1/3888 | (2015.01) |
| H04B 1/38 | (2015.01) |
| A45C 13/00 | (2006.01) |

(52) U.S. Cl.
CPC ......... *H04N 5/23216* (2013.01); *G03B 17/08* (2013.01); *G06F 1/1656* (2013.01); *H04B 1/3888* (2013.01); *H05K 5/069* (2013.01); *A45C 13/008* (2013.01); *H04B 2001/3894* (2013.01)

(58) Field of Classification Search
CPC ........ H05K 5/061; H05K 5/069; G03B 17/08; A45C 13/008; G06F 1/1656
See application file for complete search history.

(56) References Cited

U.S. PATENT DOCUMENTS

| | | | | |
|---|---|---|---|---|
| 4,097,878 A | * | 6/1978 | Cramer | G03B 17/08 396/27 |
| 4,312,580 A | * | 1/1982 | Schwomma | G03B 17/08 340/605 |
| 4,375,323 A | * | 3/1983 | Inagaki | G03B 17/08 396/27 |
| 4,383,743 A | * | 5/1983 | Nozawa | G03B 17/08 396/29 |
| 4,836,256 A | * | 6/1989 | Meliconi | H01H 9/0242 206/305 |
| 5,002,184 A | * | 3/1991 | Lloyd | A45C 11/24 206/305 |
| 5,025,921 A | * | 6/1991 | Gasparaitis | H04B 1/3888 150/165 |
| 5,388,691 A | * | 2/1995 | White | A45C 11/00 206/305 |
| 5,946,501 A | * | 8/1999 | Hayakawa | G03B 17/08 396/25 |
| 5,956,291 A | * | 9/1999 | Nehemiah | H04B 11/00 367/131 |
| 6,092,707 A | * | 7/2000 | Bowes, Jr. | H04B 1/3888 206/320 |

(Continued)

*Primary Examiner* — Adrian S Wilson
(74) *Attorney, Agent, or Firm* — W&K IP

(57) ABSTRACT

This disclosure has disclosed a novel device for operating touch screen underwater, including a hollow shell, the shell includes a bottom shell and a middle frame. The bottom shell is provided with a camera window. The shell is provided with a partition plate. The partition plate divides the shell into a first chamber configured to accommodate a mobile phone, and a second chamber configured to accommodate a camera controller. The camera controller is provided with a plurality of buttons which are configured to control the mobile phone camera shooting. The middle frame is covered with a movable surface cover at upward side. The surface cover is provided with a transparent window for showing the screen at an upper part of the surface cover. The device in this disclosure can control the mobile phone to shoot underwater.

10 Claims, 4 Drawing Sheets

(56) References Cited

U.S. PATENT DOCUMENTS

| | | | | |
|---|---|---|---|---|
| 6,128,441 A | * | 10/2000 | Kamata | G03B 17/08 348/81 |
| 6,456,487 B1 | * | 9/2002 | Hetterick | G06F 1/1632 312/223.2 |
| 6,594,472 B1 | * | 7/2003 | Curtis | H04M 1/0252 379/428.01 |
| 6,721,651 B1 | * | 4/2004 | Minelli | G01C 21/20 156/66 |
| 7,194,291 B2 | * | 3/2007 | Peng | H04B 1/3888 455/575.8 |
| 2002/0085709 A1 | * | 7/2002 | Hsu | H04M 1/0249 379/433.11 |
| 2002/0136557 A1 | * | 9/2002 | Shimamura | G03B 17/08 396/535 |
| 2002/0137475 A1 | * | 9/2002 | Shou | H04B 1/3838 455/575.8 |
| 2002/0193136 A1 | * | 12/2002 | Halkosaari | H04M 1/0283 455/550.1 |
| 2003/0095374 A1 | * | 5/2003 | Richardson | G06F 1/1626 361/679.3 |
| 2005/0094024 A1 | * | 5/2005 | Sato | H04N 5/2252 348/360 |
| 2005/0115852 A1 | * | 6/2005 | Funahashi | G03B 17/08 206/316.2 |
| 2007/0071423 A1 | * | 3/2007 | Fantone | G03B 17/08 396/27 |
| 2007/0110416 A1 | * | 5/2007 | Yamaguchi | G03B 17/08 396/27 |
| 2007/0115387 A1 | * | 5/2007 | Ho | A45C 11/38 348/375 |
| 2009/0028535 A1 | * | 1/2009 | Funahashi | G03B 17/08 396/27 |
| 2009/0032420 A1 | * | 2/2009 | Zenzai | G03B 17/08 206/316.2 |

* cited by examiner

DEVICE FOR OPERATING TOUCH SCREEN UNDERWATER

TECHNICAL FIELD

This disclosure relates to protective sleeve for mobile terminal, specially relates to a novel device for operating touch screen underwater.

BACKGROUND OF THE PRESENT INVENTION

People in modern society can't leave mobile phone, especially people who are busy with work may need to use mobile phone when swimming, taking a bath, being in the rain or water. It's know to all that mobile phone can't be flooded water or touch with water. Therefore, in this case, a person is unable to carry a mobile phone or other mobile terminal, which is inconvenience. After all, people usually will not spend much time in above situations, it is not suitable for these people to buy waterproof mobile phones to meet this kind of small requirement. Therefore, only waterproof protective sleeve can be used to protect mobile phone from water.

In existing technology, mobile phone waterproof sleeve usually sleeves the screen and camera of the mobile phone, this kind of waterproof sleeve only has waterproof function, however people is unable to take pictures or operate the mobile phone underwater.

Therefore, existing technology has yet to be improved.

SUMMARY OF PRESENT INVENTION

In view of the above shortcomings in existing technology, the objective of this disclosure is to provide a novel device for operating touch screen underwater, aiming to solve the problem in the existing waterproof sleeve that only has waterproof function, but unable to operate the mobile phone to take pictures underwater.

In order to achieve the above objective, this disclosure provides the following technical solution:

A novel device for operating touch screen underwater, including:

a hollow shell which comprises a bottom shell and a middle frame extending from the periphery of the bottom shell; the bottom shell is provided with a camera window at an upper portion of the bottom shell for transmitting light for a camera.

The shell is provided with a partition plate at lower side of the interior of the shell; the partition plate divides the shell into a first chamber configured to accommodate a mobile phone, and a second chamber configured to accommodate a camera controller; the camera controller is provided with a plurality of buttons which are configured to control the mobile phone camera shooting.

The middle frame is covered with a movable surface cover at upward side; the surface cover is provided with a transparent window at an upper part of the surface cover for showing the screen; and the surface cover is provided with a plurality of step holes at a lower part of the surface cover for accommodating the plurality of buttons.

Preferably, in the novel device for operating touch screen underwater, the surface cover is hinged with the middle frame through a hinge at an upper part of the surface cover; the middle frame is provided with a buckle at a lower part, the buckle is configured to buckle the surface cover.

Preferably, in the novel device for operating touch screen underwater, either side of left and right sides of the middle frame is provided with a holder.

Preferably, in the novel device for operating touch screen underwater, the bottom cover is provided with a raised on an outer surface at the side close to the buckle; an upper surface of the raised is provided with a plurality of holding grooves.

Preferably, in the novel device for operating touch screen underwater, the first chamber is provided with two clamp plates at a lower side, the two clamp plates are configured to clamp the mobile phone.

Preferably, in the novel device for operating touch screen underwater, the camera controller is controlled by an APP in a mobile terminal.

Preferably, in the novel device for operating touch screen underwater, the camera controller comprises: a case provided in the second chamber, the case is accommodated with a control mainboard, the case is covered with an upper cover, the upper cover is connected with a waterproof soft gluesheath at the surface of the upper cover;

the control mainboard is electrically connected with a lithium battery and a USB port configured to charge the lithium battery.

Preferably, in the novel device for operating touch screen underwater, the case is provided with a waterproof plug configured to cover the USB port.

Preferably, in the novel device for operating touch screen underwater, the buttons comprise:

an on/off button configured to turn on or off the camera controller, a model button provided at one side of the on/off button, a shutter button provided at one side of the model button;

an up button, a down button, a left button and a right button, which are configured to control to move upward, downward, towards left and towards right respectively; and an enter button provided in the central of the up button, the down button, the left button and the right button.

Preferably, in the novel device for operating touch screen underwater, below the on/off button is provided with a plurality of indicator lights.

Compared with the existing technology, the novel device for operating touch screen underwater provided in this disclosure includes: a hollow shell, the shell includes a bottom shell and a middle frame extending from the periphery of the bottom shell. The bottom shell is provided with a camera window at an upper portion for transmitting light for a camera. The shell is provided with a partition plate at lower side of the interior of the shell. The partition plate divides the shell into a first chamber configured to accommodate a mobile phone, and a second chamber configured to accommodate a camera controller. The camera controller is provided with a plurality of buttons which are configured to control the mobile phone camera shooting. The middle frame is covered with a movable surface cover at upward side. The surface cover is provided with a transparent window for showing the screen at an upper part of the surface cover. The surface cover is also provided with a plurality of step holes at a lower part of the surface cover for accommodating the plurality of buttons, such that controlling the mobile phone through the camera controller to shoot underwater is available. The user experience is improved.

DETAILED DESCRIPTION OF PREFERRED EMBODIMENTS

In order to make the objective, technical solution and effects of this disclosure more clear and explicit, this disclosure will be described in detail with reference to the accompanying drawings and preferred embodiments. It is to be understood that the described detailed embodiments are only used to explain the invention but not intended to limit the invention.

Figure 1:
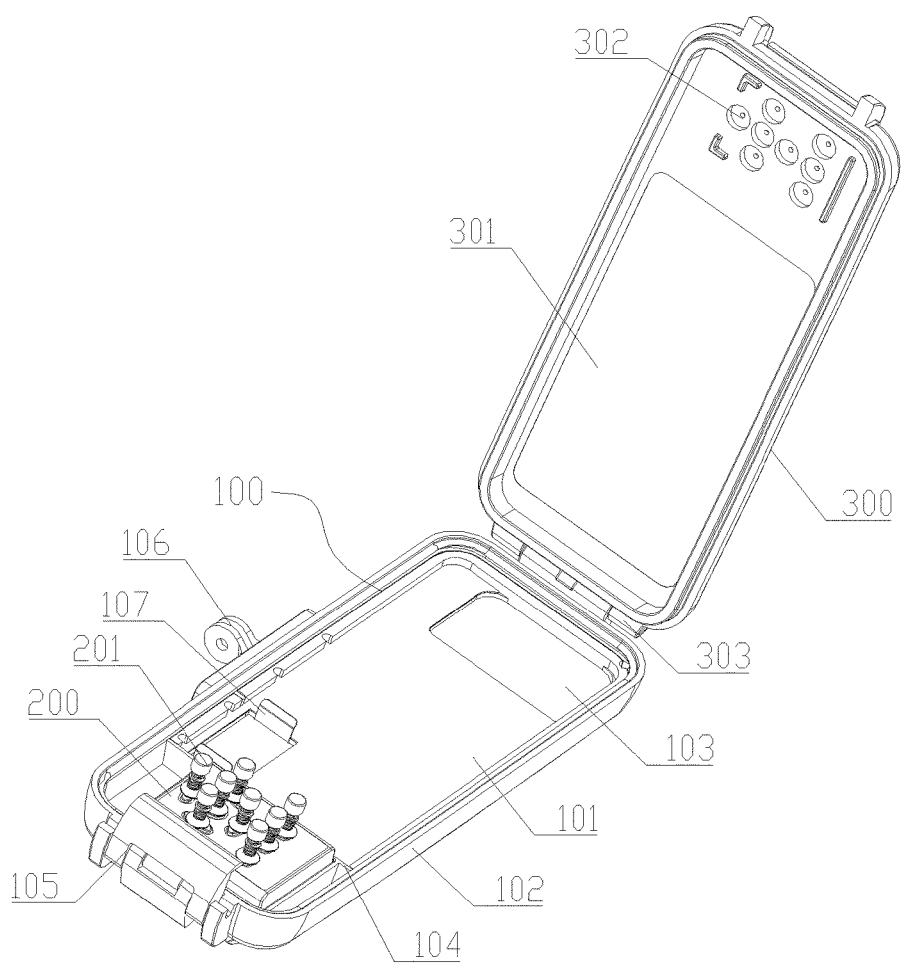
FIG. 1 is a first schematic diagram of a preferred embodiment of a novel device for operating touch screen underwater in this disclosure.
Figure 2:
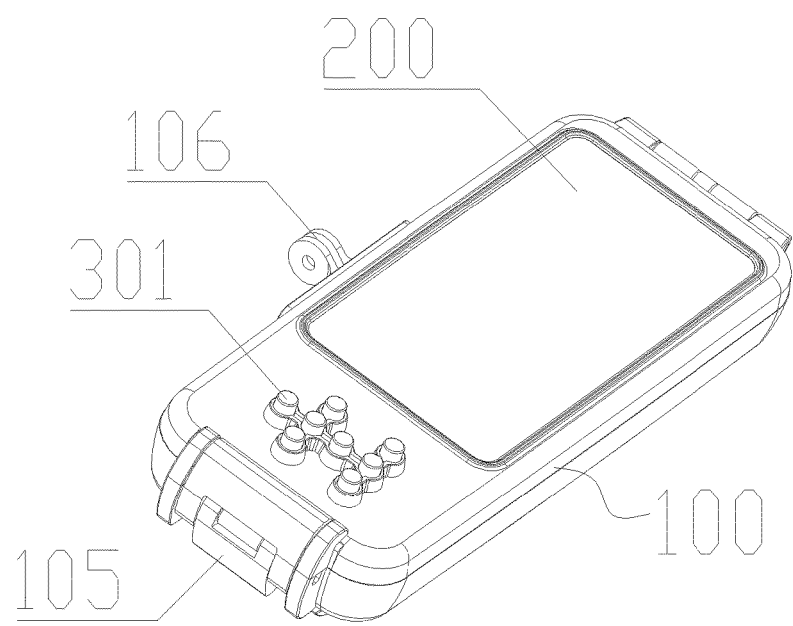
FIG. 2 is a second structure diagram of the preferred embodiment of a novel device for operating touch screen underwater.
Figure 3:
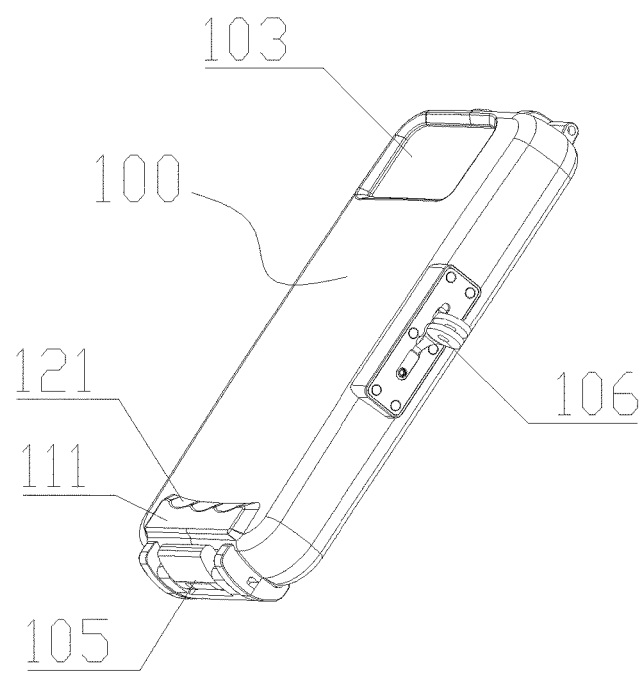
FIG. 3 is a third schematic diagram of the preferred embodiment of a novel device for operating touch screen underwater in this disclosure.

As shown in FIGS. 1-3, this disclosure provides a novel device for operating touch screen underwater, including a hollow shell 100, the shell 100 includes a bottom shell 101 and a middle frame 102 extending from the periphery of the bottom shell 101. The bottom shell 101 is provided with a camera window 103 at an upper portion for transmitting light for a camera. The shell 100 is provided with a partition plate 104 at lower side of the interior of the shell 100. The partition plate 104 divides the shell 100 into a first chamber configured to accommodate a mobile phone, and a second chamber configured to accommodate a camera controller 200. The camera controller 200 is provided with a plurality of buttons 201 which are configured to control the mobile phone camera shooting. The middle frame 102 is covered with a movable surface cover 300 at upward side. The surface cover 300 is provided with a transparent window 301 for showing the screen at an upper part of the surface cover 300. The surface cover 300 is also provided with a plurality of step holes 302 at a lower part of the surface cover 300 for accommodating the plurality of buttons 201.

This mobile phone protective sleeve has excellent waterproof function, can guarantee a mobile phone being able to be used underwater. The mobile phone is placed at the first chamber of the novel underwater operating touch screen. Please note that, the camera of the mobile phone should be corresponded to camera window 103 side. Then cover the surface cover 300, and put the mobile phone in water. By buttons 201 on the camera controller 200, the user can control the mobile phone to shoot. User experience is improved.

In a further preferred embodiment of this disclosure, the surface cover 300 is hinged with the middle frame 102 through a hinge 303 at an upper part of the surface cover 300. The middle frame 102 is provided with a buckle 105 at a lower part, the buckle 105 is configured to buckle the surface cover 300.

In a further preferred embodiment of this disclosure, middle part of either side of the left and right sides of the middle frame 102 is provided with a holder 106.

In a further preferred embodiment of this disclosure, the bottom cover 101 is provided with a raised 111 on the outer surface at the side close to the buckle 105. An upper surface of the raised 111 is provided with a plurality of holding grooves 121.

In a further preferred embodiment of this disclosure, the first chamber is provided with two clamp plates 107 at a lower side, the clamp plates 107 are configured to clamp the mobile phone.

The clamp plates 107 are configured to clamp the mobile phone. As a result, mobile phones of different sizes can be clamped through the clamp plates 107. The mobile phone waterproof sleeve can be adapted to mobile phones of different sizes, improving the user's conveniences.

In a further preferred embodiment of this disclosure, the camera controller 200 can be controlled by an APP in the mobile terminal.

Figure 4:
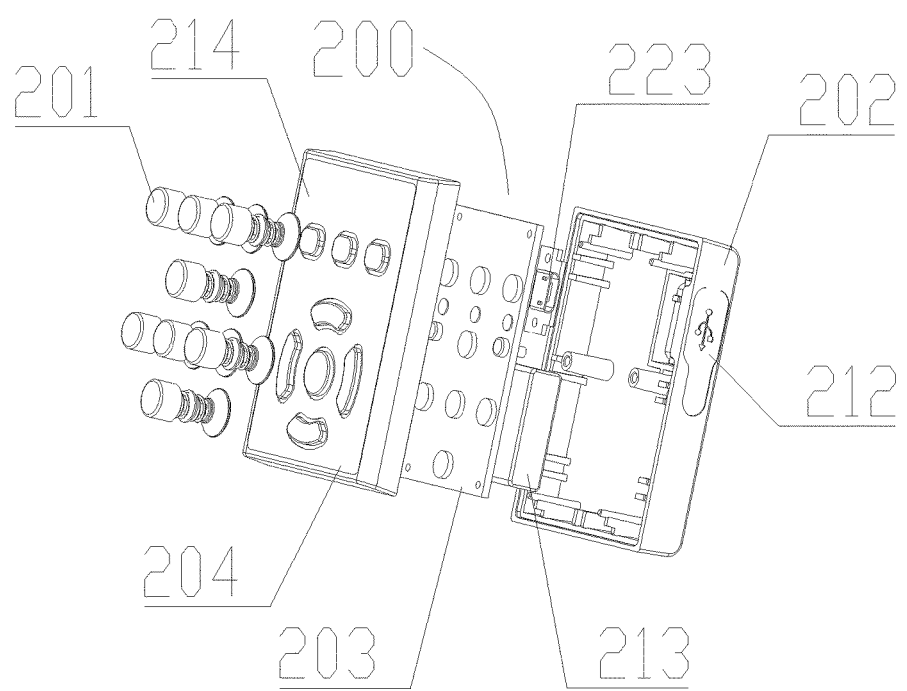
FIG. 4 is a structure schematic diagram of a camera controller in the preferred embodiment of a novel device for operating touch screen underwater in this disclosure.

As shown in FIG. 4, the camera controller 200 includes: a case 202 provided in the second chamber. The case 202 is accommodated with a control mainboard 203. The case 202 is covered with an upper cover 204. The upper cover 204 is connected with a waterproof soft gluesheath 214 at the surface of the upper cover 204. The control mainboard 203 is electrically connected with a lithium battery 213 and a USB port 223 configured to charge the lithium battery 213.

When implementing, the lithium battery 213 is set as a large capacity battery, which can keep a long time service.

In a further preferred embodiment of this disclosure, the case 202 is provided with a waterproof plug 212 configured to cover the USB port 223.

In a further preferred embodiment of this disclosure, the buttons 201 include: an on/off button configured to turn on or off the camera controller, a model button provided at one side of the on/off button, a shutter button provided at one side of the model button, and an up button, a down button, a left button and a right button, configured to control to move upward, downward, towards left and towards right respectively, and an enter button provided in the central of the up button, the down button, the left button and the right button.

When implementing, these buttons can be set into different shapes, for example, cylinder.

In a further preferred embodiment of this disclosure, below the on/off button is provided with a plurality of indicator lights.

In the present disclosure, the inner side of the middle frame is provided with a waterproof structure (for example, a rubber ring can be used), which is deeply waterproof and stable.

As the touch screen is unable to be touched underwater, this product can control the buttons 201 remotely through the APP in a mobile terminal and control the mobile phone through signal transmission. As a result, selfprotrait, shooting underwater or browsing the photo album underwater, or starting or shutting down software underwater is realized. When ashore, the user can also take the buttons 201 out to manipulate selfprotrait remotely.

In conclusion, this disclosure has disclosed a novel device for operating touch screen underwater, including a hollow shell, the shell includes a bottom shell and a middle frame extending from the periphery of the bottom shell. The bottom shell is provided with a camera window at an upper portion for transmitting light for a camera. The shell is provided with a partition plate at lower side of the interior of the shell. The partition plate divides the shell into a first chamber configured to accommodate a mobile phone, and a second chamber configured to accommodate a camera controller. The camera controller is provided with a plurality of buttons which are configured to control the mobile phone camera shooting. The middle frame is covered with a movable surface cover at upward side. The surface cover is provided with a transparent window for showing the screen at an upper part of the surface cover. The surface cover is also provided with a plurality of step holes at a lower part of the surface cover for accommodating the plurality of buttons, such that controlling the mobile phone to shoot underwater through the camera controller is available. The user experience is improved It is to be understood that, the skilled in the art can make variations and substitutes according to the technical solution and the conception of the present invention, and those variations and substitutes all fall in the appended claims of the present invention.

I claim:

1. A novel device for operating touch screen underwater, comprising:
    a hollow shell which comprises a bottom shell and a middle frame extending from periphery of the bottom shell;
    wherein the bottom shell is provided with a camera window at an upper portion for transmitting light for a camera;
    the shell is provided with a partition plate at lower side of the interior of the shell;
    the partition plate divides the shell into a first chamber configured to accommodate a mobile phone, and a second chamber configured to accommodate a camera controller;
    the camera controller is provided with a plurality of buttons which are configured to control the mobile phone camera shooting;
    the middle frame is covered with a movable surface cover at upward side;
    the surface cover is provided with a transparent window at an upper part of the surface cover for showing the screen; and
    the surface cover is provided with a plurality of step holes at a lower part of the surface cover for accommodating the plurality of buttons.

2. The novel device for operating touch screen underwater of claim 1, wherein the surface cover is hinged with the middle frame through a hinge at an upper part of the surface cover;
    the middle frame is provided with a buckle at a lower part, the buckle is configured to buckle the surface cover.

3. The novel device for operating touch screen underwater of claim 1, wherein middle part of either side of left and right sides of the middle frame is provided with a holder.

4. The novel device for operating touch screen underwater of claim 1, wherein the bottom cover is provided with a raised on an outer surface at the side close to the buckle;
    an upper surface of the raised is provided with a plurality of holding grooves.

5. The novel device for operating touch screen underwater of claim 1, wherein the first chamber is provided with two clamp plates at a lower side, the two clamp plates are configured to clamp the mobile phone.

6. The novel device for operating touch screen underwater of claim 1, wherein the camera controller is controlled by an APP in a mobile terminal.

7. The novel device for operating touch screen underwater of claim 1, wherein the camera controller comprises:
    a case provided in the second chamber;
    wherein the case is accommodated with a control mainboard;
    the case is covered with an upper cover;
    the upper cover is connected with a waterproof soft gluesheath at the surface of the upper cover;
    the control mainboard is electrically connected with a lithium battery and a USB port configured to charge the lithium battery.

8. The novel device for operating touch screen underwater of claim 7, wherein the case is provided with a waterproof plug configured to cover the USB port.

9. The novel device for operating touch screen underwater of claim 7, wherein the buttons comprise:
    an on/off button configured to turn on or off the camera controller;
    a model button provided at one side of the on/off button;
    a shutter button provided at one side of the model button;
    an up button, a down button, a left button and a right button, which are configured to control to move upward, downward, towards left and towards right respectively; and
    an enter button provided in the central of the up button, the down button, the left button and the right button.

10. The novel device for operating touch screen underwater of claim 9, wherein below the on/off button is provided with a plurality of indicator lights.

* * * * *